(12) United States Patent
Kim et al.

(10) Patent No.: US 7,759,863 B2
(45) Date of Patent: Jul. 20, 2010

(54) ORGANIC ELECTROLUMINESCENT DISPLAY DEVICE AND FABRICATING METHOD THEREOF

(75) Inventors: Jung-Chul Kim, Seoul (KR); Jae-Ho Sim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 636 days.

(21) Appl. No.: 11/644,982

(22) Filed: Dec. 26, 2006

(65) Prior Publication Data

US 2007/0296333 A1    Dec. 27, 2007

(30) Foreign Application Priority Data

Jun. 22, 2006    (KR) ................ 10-2006-0056361

(51) Int. Cl.
*H01J 1/62* (2006.01)

(52) U.S. Cl. ..................................... 313/506

(58) Field of Classification Search ................. 313/484, 313/500, 503, 505–507, 512, 584, 586, 631, 313/504; 257/E51.001, E51.018, E51.005, 257/E51.002, 79
See application file for complete search history.

(56) References Cited

FOREIGN PATENT DOCUMENTS

CN        1519633        8/2004

*Primary Examiner*—Karabi Guharay
*Assistant Examiner*—Brenitra M Lee
(74) *Attorney, Agent, or Firm*—McKenna Long & Aldridge LLP

(57) ABSTRACT

An electroluminescent display device includes a shielding pattern on a substrate; a thin film transistor including a semiconductor layer that is disposed on the shielding pattern and that has an active portion and source and drain ohmic contact portions; an organic electroluminescent diode connected to the thin film transistor; and a power line connected to the thin film transistor, wherein the shielding pattern partially covers the active portion of the semiconductor layer.

6 Claims, 4 Drawing Sheets bottom emission bottom emission

US 7,759,863 B2

ORGANIC ELECTROLUMINESCENT DISPLAY DEVICE AND FABRICATING METHOD THEREOF

The present invention claims the benefit of Korean Patent Application No. 2006-0056361 filed in Korea on Jun. 22, 2006, which is hereby incorporated by reference for all purposes as if fully set forth herein.

BACKGROUND OF THE INVENTION

1. Field of the Invention

The present invention relates to a display device and a method of fabricating a display device, and more particularly, to an organic electroluminescent display (OELD) device and a method of fabricating an OELD device.

2. Discussion of the Related Art

Until recently, many display devices have employed cathode-ray tubes (CRTs) to display images. However, various types of flat panel displays, such as liquid crystal display (LCD) devices, plasma display panel (PDP) devices, field emission display (FED) devices, and electro-luminescent display (ELD) devices, are currently being developed as substitutes for the CRTs. Among these various types of flat panel displays, OELD devices are a luminescent display with such advantages as fast response time, high brightness and wide viewing angles.

FIG. 1 is a circuit diagram illustrating an OELD device according to the related art.

Referring to FIG. 1, an OELD device includes a switching thin film transistor STr, a driving thin film transistor DTr, a storage capacitor StgC and an organic electroluminescent diode E in a pixel region P.

A gate line GL extends along a first direction, a data line DL extends along a second direction crossing the first direction, and a power line PL is spaced apart from the data line DL. The gate line GL and the data line DL define the pixel region P.

The switching thin film transistor STr is disposed at a crossing portion of the gate and data lines GL and DL. The driving thin film transistor DTr is connected to the switching thin film transistor STr. The organic electroluminescent diode E is connected to the driving thin film transistor DTr. A first electrode of the organic electroluminescent diode E is connected to a drain electrode of the driving thin film transistor DTr, and a second electrode of the organic electroluminescent diode E is connected to a ground terminal. The power line PL is connected to a source electrode of the driving thin film transistor DTr. The storage capacitor StgC is connected to a gate electrode and the drain electrode of the driving thin film transistor DTr.

When a gate voltage having an on level is applied to the gate line GL, the switching thin film transistor STr is turned on. A data voltage is applied to the driving thin film transistor DTr though the data line DL and the switching thin film transistor STr so that the driving thin film transistor DTr is turned on. Accordingly, a diode current flows on the organic electroluminescent diode E. Even when the gate voltage has an off level, the storage capacitor StgC stores the gate voltage of the driving thin film transistor DTr. Accordingly, the diode current is maintained until the next frame.

OELD devices may be categorized as a top emission type and a bottom emission type according to the direction of light emission.

FIG. 2 is a cross-section view illustrating a bottom emission type OELD device according to the related art.

Referring to FIG. 2, the OELD device includes first and second substrates 10 and 30 facing each other. A seal pattern 40 is disposed at a periphery portion of the two substrates 10 and 30, and the seal pattern 40 attaches the two substrates 10 and 30 together.

A driving thin film transistor DTr is disposed on the first substrate 10. A first electrode 12 is connected to the driving thin film transistor DTr. An organic emitting layer 14 is disposed on the first electrode 12. The organic emitting layer 14 includes red (R), green (G) and blue (B) emitting layers 14a, 14b and 14c in respective pixel regions. A second electrode 16 is disposed on the organic emitting layer 14. A desiccant 32 is disposed on the second substrate 30 to absorb moisture.

FIG. 3 is a cross-sectional view enlarging a pixel region of FIG. 2. In FIG. 3, a second substrate of FIG. 2 is omitted for brevity of explanation.

Referring to FIG. 3, a semiconductor layer 55 is disposed on a substrate 50. The semiconductor layer 55 includes an active portion 55a and two ohmic contact portions 55b. A gate insulating layer 58 is disposed on the semiconductor layer 55. A gate electrode 63 is disposed on the gate insulating layer 58 corresponding to the active portion 55a. An interlayer insulating film 67 is disposed on the gate electrode 63. The gate insulating layer 58 and the interlayer insulating film 67 have first and second semiconductor contact holes 69 and 71 exposing the both ohmic contact portions 55b. Source and drain electrodes 75 and 77 contact the both ohmic contact portions 55b through the first and second semiconductor contact holes 69 and 71, respectively. A passivation layer 85 is disposed on the source and drain electrodes 69 and 71. A power line 79 is disposed on the interlayer insulating film 67.

An organic electroluminescent diode E is connected to the drain electrode 77. The organic electroluminescent diode E includes first and second electrodes 82 and 89 and an organic emitting layer 87. The organic emitting layer 87 emits light. The emitted light travels toward the substrate 50.

In the related art bottom emission type OELD device, the active layers of the switching thin film transistor and the driving thin film transistor are exposed to an exterior light, such as sunlight and light from various lamps, through the transparent substrate 50. Such an exposure negatively affects the characteristics of the switching and driving thin film transistors, such as leakage current, threshold voltage and mobility. Accordingly, the OELD device according to the related art may suffer from low contrast ratio, high power consumption and noise and the display quality may thus become degraded. In particular, the leakage current may go up to several nano amperes (nA), thereby delaying light emission and degrading the thin film transistors and organic electroluminescent diode.

SUMMARY OF THE INVENTION

Accordingly, the present invention is directed to an OELD device and a method of fabricating an OELD device that substantially obviate one or more of problems due to limitations and disadvantages of the related art.

An advantage of the present invention is to provide an OELD device with an improved display quality.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an electroluminescent display device includes a shielding pattern on a substrate; a thin film transistor including a semiconductor layer that is disposed on the shielding pattern and that has an active portion and source and drain ohmic contact portions; an organic electroluminescent diode connected to the thin film transistor; and a power line connected to the thin film transistor, wherein the shielding pattern partially covers the active portion of the semiconductor layer.

In another aspect, an electroluminescent display device includes a shielding pattern on a substrate; a thin film transistor including a semiconductor layer that is disposed on the shielding pattern and that has an active portion and source and drain ohmic contact portions; an organic electroluminescent diode connected to the thin film transistor; and a power line connected to the thin film transistor and the shielding pattern, wherein the shielding pattern covers the active portion.

In yet another aspect, a display device includes a plurality of gate lines and a plurality of data lines crossing each other to define a plurality of pixels on a substrate; a thin film transistor in each pixel, the thin film transistor including a gate electrode, source and drain electrode, and a channel region; a pixel electrode electrically connected to the drain electrode; and a shielding pattern partially covering the channel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Figure 2:
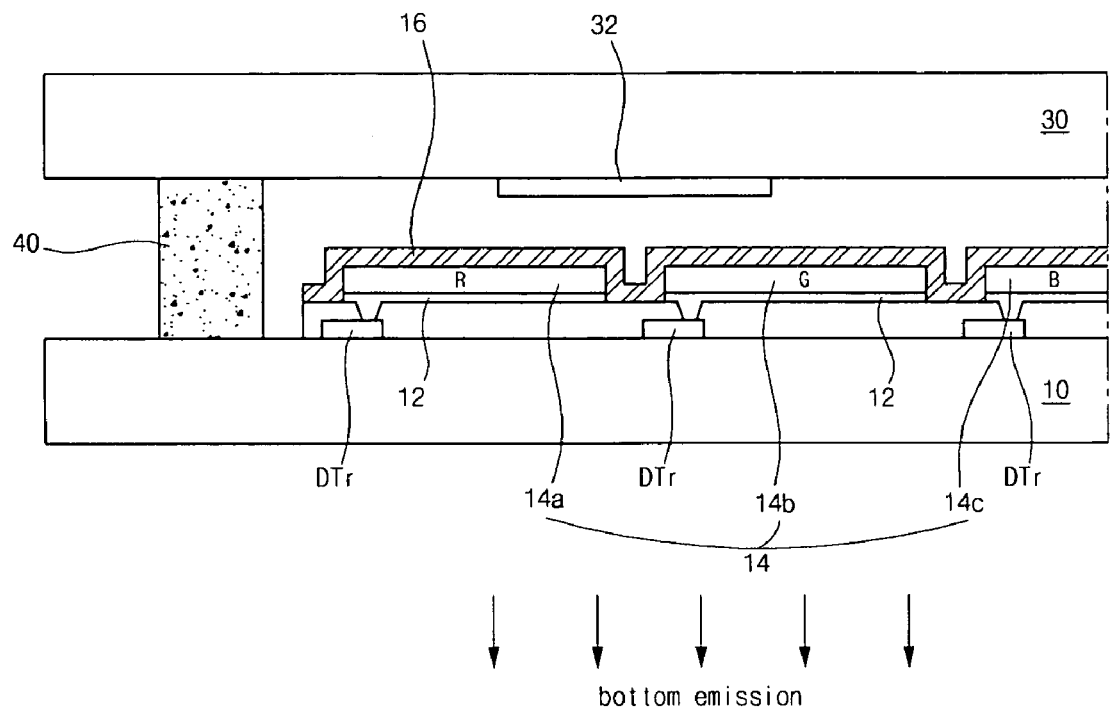
FIG. 2 is a cross-section view illustrating a bottom emission type OELD device according to the related art.
Figure 3:
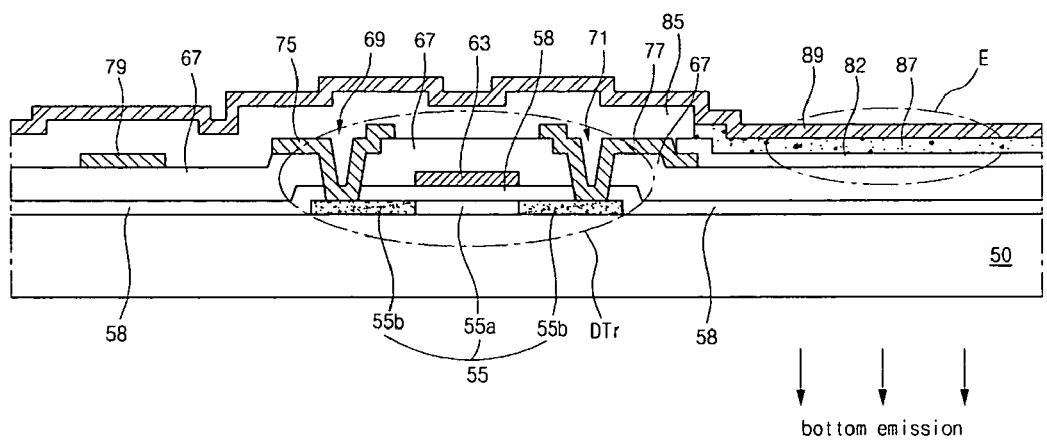
FIG. 3 is a cross-sectional view enlarging a pixel region of FIG. 2.
Figure 4:
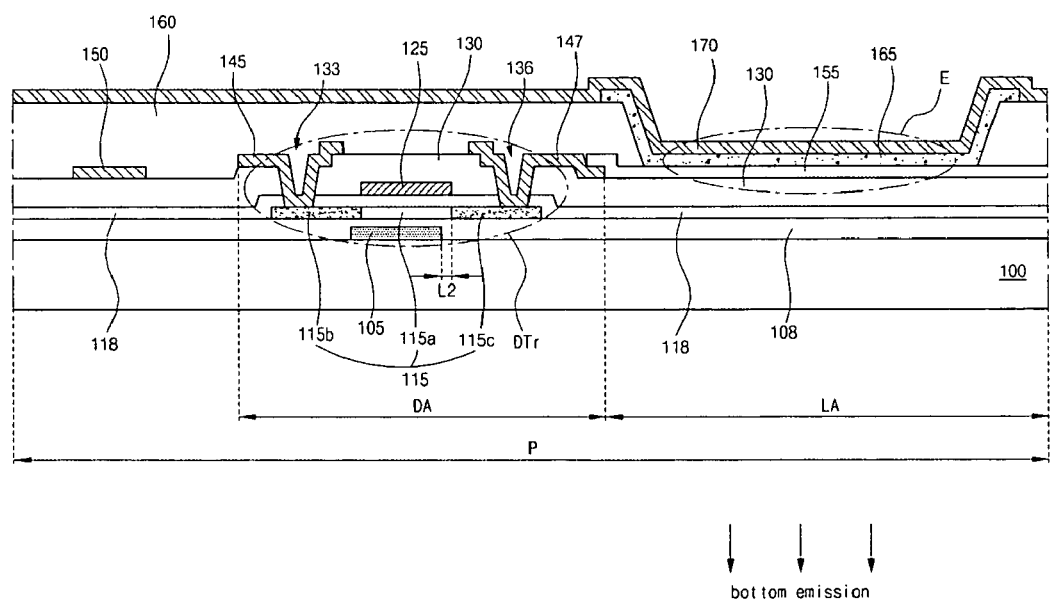
FIG. 4 is a cross-sectional view illustrating an OELD device according to a first embodiment of the present invention.

FIG. 4 is a cross-sectional view illustrating an OELD device according to a first embodiment of the present invention. In FIG. 4, a second substrate and a desiccant, as illustrated in FIG. 2, are omitted for brevity of explanation.

Referring to FIG. 4, an OELD device according to the first embodiment of the present invention includes a shielding pattern 105 formed on a transparent substrate 100. The shielding pattern 105 shields an active layer 115a from an exterior light, such as sunlight and light from various lamps. The shielding pattern 105 may include an organic insulating material, an inorganic insulating material or a metallic material to shield the active layer 115a from being exposed to an exterior light.

A buffer layer 108 is formed entirely on the substrate 100 having the shielding pattern 105. The buffer layer 108 has an even upper surface.

A semiconductor layer 115 is formed on the buffer layer 108. The semiconductor layer 115 includes an active portion 115a at a center portion of the semiconductor layer 115, and source and drain ohmic contact portions 115b and 115c at both sides of the semiconductor layer 115. The active portion 115a is a channel of the semiconductor layer 115. The semiconductor layer 115 may be made of poly-crystalline silicon. The active portion 115a may be made of intrinsic poly-crystalline silicon, and the ohmic contact portions 115b and 115c may be made of impurity-doped poly-crystalline silicon. Because the buffer layer 108 has the even upper surface, the semiconductor layer 115 does not have steps.

A gate insulating layer 118 is formed entirely on the substrate 100 having the semiconductor layer 115. A gate electrode 125 is formed on the gate insulating layer 118 corresponding to the active portion 115a. Although not show in the drawings, a gate line is formed during the same process of forming the gate electrode 125.

An interlayer insulating film 130 is formed entirely on the substrate 100 having the gate electrode 125. The gate insulating layer 118 and the interlayer insulating film 130 have first and second semiconductor contact holes 133 and 136 exposing the source and drain ohmic contact portions 115b and 115c, respectively.

Source and drain electrodes 145 and 147 are formed on the interlayer insulating film 130. The source and drain electrodes 145 and 147 contact the source and drain ohmic contact portions 115b through the first and second semiconductor contact holes 133 and 136, respectively. Although not shown in the drawings, a data line is formed during the same process of forming the source and drain electrodes 145 and 147. The gate and data lines cross each other to define a pixel region P.

A driving thin film transistor DTr includes the semiconductor layer 115, the gate electrode 125, and the source and drain electrodes 145 and 147. The driving thin film transistor DTr is disposed in a driving region DA of the pixel region P. Although not shown in the drawings, a switching thin film transistor, which is connected to the gate and data lines, is formed in a similar manner to the driving thin film transistor DTr. A gate electrode of the driving thin film transistor DTr is connected to a drain electrode of the switching thin film transistor. A gate electrode of the switching thin film transistor is connected to the gate line, and a source electrode of the switching thin film transistor is connected to the data line. Also, when the OELD device includes a driving circuit on the substrate 100, thin film transistors constituting the driving circuit may be formed in a similar manner to the driving and switching thin film transistors.

Figure 1:
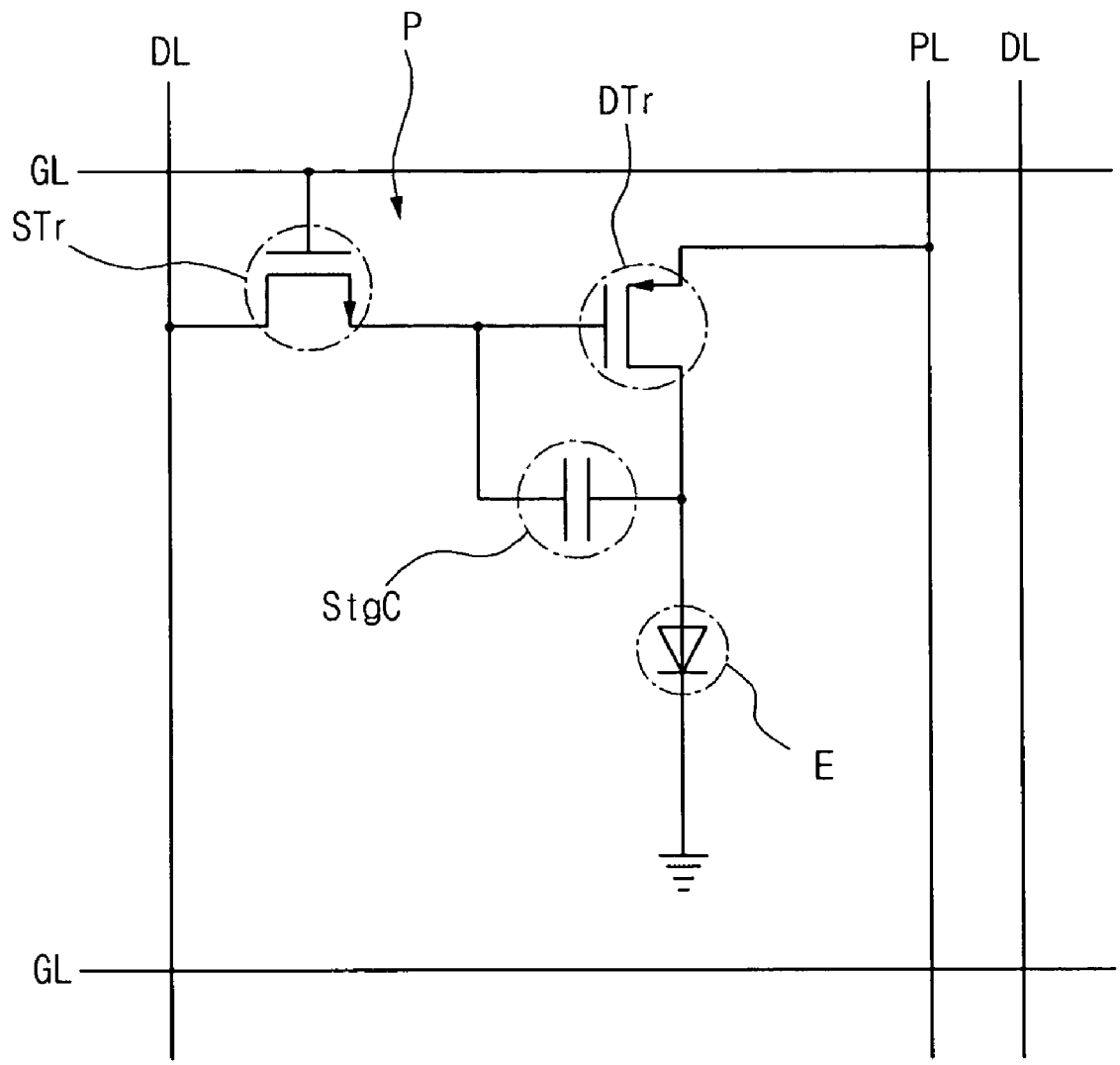
FIG. 1 is a circuit diagram illustrating an OELD device according to the related art.

A power line 150 is formed on the interlayer insulating film 130. The power line 150 is connected to a source electrode of the driving thin film transistor DTr, as similar to FIG. 1. The power line 150 may be disposed outside the source electrode 145. The power line 150 may be formed in the same process as the source and drain electrodes 145 and 147, and the source electrode 145 may extend from the power line 150.

An electroluminescent diode E is connected to the driving thin film transistor DTr. The electroluminescent diode E includes first and second electrodes 155 and 170, and an organic emitting layer 165 between the first and second electrodes 155 and 170 and emits light.

The first electrode 155 is formed on the interlayer insulating film 130 and contacts the drain electrode 147. A passivation layer 160 is formed on the source and drain electrodes 145 and 147. The passivation layer 160 covers the power line 150, the source and drain electrodes 133 and 135, and side portions of the first electrode 155. The passivation layer 160 has an opening corresponding to an emitting region LA.

The organic emitting layer 165 contacts the first electrode 155 through the opening of the passivation layer 160. The organic emitting layer 165 contacts a side surface and partially contacts an upper surface of the passivation layer 160.

The first electrode 155 is transparent and the second electrode 170 is opaque so that light emitted from the organic emitting layer 155 travels toward the substrate 100. The first electrode 155 may be formed in each pixel region P, and the second electrode 170 may be formed throughout the plurality of pixel regions P. The second electrode 170 may completely cover the active layer 115a.

The first electrode 155 may function as an anode and the second electrode 170 may function as a cathode, and the first electrode 155 may have a work function higher than the second electrode 170. The first electrode 155 may include a transparent conductive material including indium-tin-oxide (ITO), indium-zinc-oxide (IZO), indium-tin-zinc-oxide (ITZO) or the like.

The organic emitting layer 155 may include a hole injection layer, a hole transporting layer, an emitting material layer, an electron transporting layer and an electron injection layer. When the first and second electrodes 155 and 170 function as the anode and the cathode, respectively, the hole injection layer, the hole transporting layer, the emitting material layer, the electron transporting layer and the electron injection layer may be sequentially disposed in a direction from the first electrode 155 to the second electrode 170.

A positional relationship of the shielding pattern 105 and the semiconductor layer 115 is explained in more detail with reference to FIGS. 4 and 5.

Figure 5:
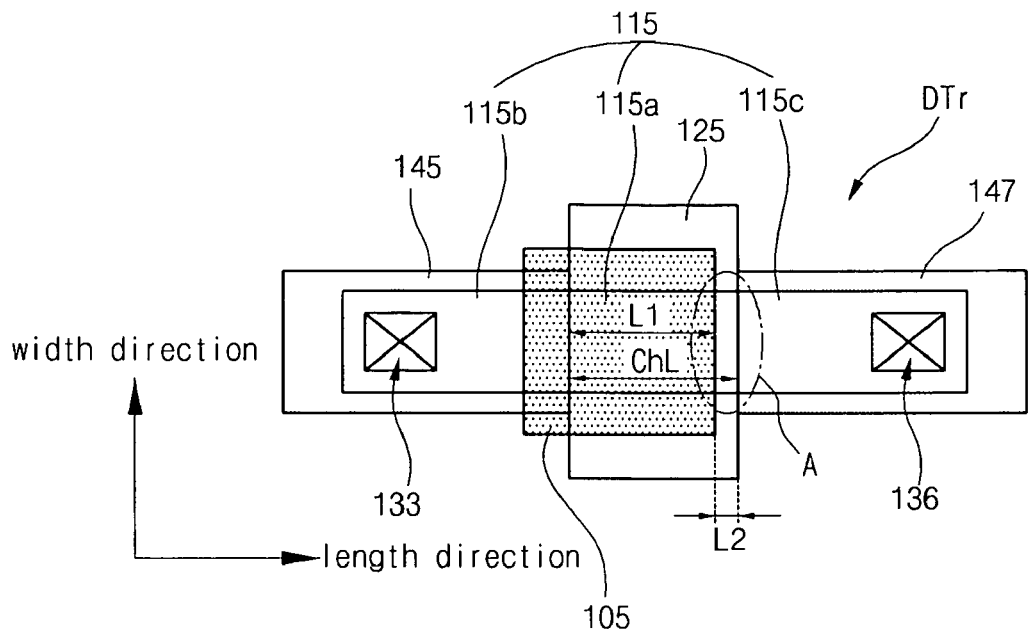
FIG. 5 is a plan view illustrating the driving thin film transistor of the FIG. 4.

FIG. 5 is a plan view illustrating the driving thin film transistor of the FIG. 4. In FIG. 5, a length direction is defined as a direction from the source ohmic contact portion to the drain ohmic contact portion, and a width direction is defined as a direction perpendicular to the length direction.

Referring to FIGS. 4 and 5, the shielding pattern 105 may partially cover the active portion 115a. A covered part of the active layer 115a may be near the source ohmic contact portion 115b, and an uncovered part A of the active layer 115a may be near the drain ohmic contact portion 115c.

An area of the covered part may be about 0.9 to 0.95 of an area of the active portion 115a, and an area of the uncovered part may be about 0.05 to 0.1 of an area of the active portion 115a. A length L1 of the covered part may be about 0.9 to 0.95 of a length ChL of the active portion 115a (i.e, a channel length), and a length L2 of the uncovered part A may be about 0.05 to 0.1 of the length ChL of the active portion 115a.

A width of the shielding pattern 105 may be equal to or greater than a width of the active layer 115a (i.e., a channel width) so that the shielding pattern 105 completely covers the covered part along the width direction.

The shielding pattern 105 is electrically floated, and the shielding pattern 105 functions as a floating gate electrode. This causes a body effect that shifts a threshold voltage of the driving thin film transistor. To reduce the body effect, the shielding pattern 105 does not completely cover the active layer 115a, which causes an exterior light incident on the uncovered part A to produce a leakage current that compensates for the body effect.

As described above, in the first embodiment, the shielding pattern in the driving transistor partially covers the active layer. Accordingly, an exterior light is effectively shielded and the driving thin film transistor can be operated normally. As a result, contrast ratio increases, power consumption and noise decrease, and thus display quality can be improved. Also, the reliability of the thin film transistor and the organic electroluminescent diode can be increased.

The shielding pattern in the first embodiment may be applicable to the switching thin film transistor. The shielding pattern for the switching thin film transistor may completely cover an active layer of the switching thin film transistor. Also, the shielding pattern may be applicable to thin film transistors for a driving circuit formed on the same substrate.

Figure 6:
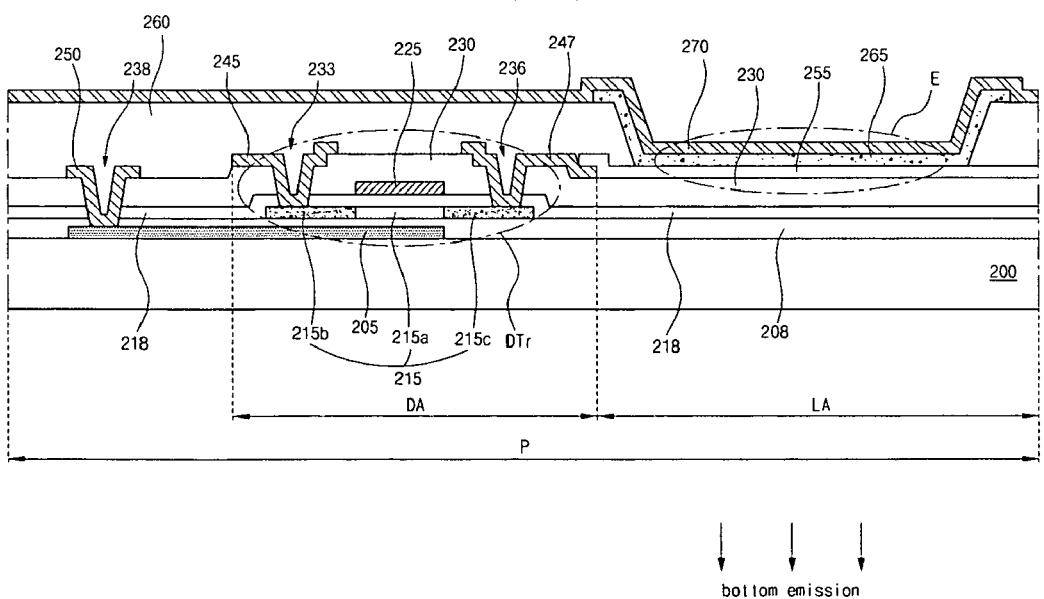
FIG. 6 is a cross-sectional view illustrating an OELD device according to a second embodiment of the present invention.

FIG. 6 is a cross-sectional view illustrating an OELD device according to a second embodiment. The OELD device of the second embodiment is similar to that of the first embodiment, except for structures of a power line and a shielding pattern. Accordingly, explanations of parts similar to those of the first embodiment may be omitted.

Referring to FIG. 6, the OELD device includes a shielding pattern 205 that may completely cover an active layer 215a. The shielding pattern 205 also may extend below a power line 250 so that the shielding pattern 205 contacts the power line 250. In the first embodiment, the active layer is not completely covered by the shielding pattern to compensate for the body effect. In the second embodiment, the shielding pattern 205 contacts the power line 250 so that the shielding pattern 205 is not electrically floated. Accordingly, the shielding pattern 205 may completely cover the active layer 215a to shield the active layer 215a from an exterior light.

The shielding pattern 205 is formed on a substrate 200. The shielding pattern 205 shields the exterior light, such as sunlight and light from various lamps. The shielding pattern 205 may include an organic insulating material, an inorganic insulating material or a metallic material to shield an active layer 215a from an exterior light.

A buffer layer 208 is formed entirely on the substrate 200 having the shielding pattern 205. The buffer layer 208 has an even upper surface.

A semiconductor layer 215 is formed on the buffer layer 208. The semiconductor layer 215 includes the active portion 215a at a center portion of the semiconductor layer 215, and source and drain ohmic contact portions 215b and 215c at both sides of the semiconductor layer 215. The active portion 215a is a channel of the semiconductor layer 215. The semiconductor layer 215 may be made of poly-crystalline silicon. The active portion 215a may be made of intrinsic poly-crystalline silicon, and the ohmic contact portions 215b and 215c may be made of impurity-doped poly-crystalline silicon. Because the buffer layer 208 has the even upper surface, the semiconductor layer 215 does not have steps.

A gate insulating layer 218 is formed entirely on the substrate 200 having the semiconductor layer 215. A gate electrode 225 is formed on the gate insulating layer 218 corresponding to the active portion 215a. Although not show in the drawings, a gate line is formed during the same process as the gate electrode 225.

An interlayer insulating film 230 is formed entirely on the substrate 200 having the gate electrode 225. The gate insulating layer 218 and the interlayer insulating film 230 have first and second semiconductor contact holes 233 and 236 exposing the source and drain ohmic contact portions 215b and 215c, respectively. The buffer layer 208, the gate insulating layer 218 and the interlayer insulating film 230 has a shielding pattern contact hole 238 exposing the shielding pattern 205.

Source and drain electrodes 245 and 247 are formed on the interlayer insulating film 230. The source and drain electrodes 245 and 247 contact the source and drain ohmic contact portions 215b and 215c through the first and second semiconductor contact holes 233 and 236, respectively. Although not shown in the drawings, a data line is formed during the same process as the source and drain electrodes 245 and 247. The gate and data lines cross each other to define a pixel region P.

A driving thin film transistor DTr includes the semiconductor layer 215, the gate electrode 225, and the source and drain electrodes 245 and 247. The driving thin film transistor DTr is disposed in a driving region DA of the pixel region P. Although not shown in the drawings, a switching thin film transistor, which is connected to the gate and data lines, is formed in a similar manner to the driving thin film transistor DTr. A gate electrode of the driving thin film transistor DTr is connected to a drain electrode of the switching thin film transistor. A gate electrode of the switching thin film transistor is connected to the gate line, and a source electrode of the switching thin film transistor is connected to the data line. Also, when the OELD device includes a driving circuit on the substrate 200, thin film transistors constituting the driving circuit may be formed in the same manner as the driving and switching thin film transistors.

A power line 250 is formed on the interlayer insulating film 230. The power line 250 is connected to a source electrode of the driving thin film transistor DTr, as similar to FIG. 1. The power line 250 may be disposed outside the source electrode 245. The power line 250 may be formed in the same process as the source and drain electrodes 245 and 247, and the source electrode 245 may extend from the power line 250. The power line 250 contacts an end of the shielding pattern 205 through the shielding pattern contact hole 238 so that the shielding pattern 205 is applied with a power voltage. Accordingly, the shielding pattern 205 does not function as a floating gate electrode.

An electroluminescent diode E is connected to the driving thin film transistor DTr. The electroluminescent diode E includes first and second electrodes 255 and 270, and an organic emitting layer 265 between the first and second electrodes 255 and 270 and emits light.

The first electrode 255 is formed on the interlayer insulating film 230 and contacts the drain electrode 247. A passivation layer 260 is formed on the source and drain electrodes 245 and 247. The passivation layer 260 covers the power line 250, the source and drain electrodes 245 and 247, and side portions of the first electrode 255. The passivation layer 260 has an opening corresponding to an emitting region LA.

The first electrode 255 may be formed in each pixel region P, and the second electrode 270 may be formed throughout the plurality of pixel regions P. The second electrode 270 may completely cover the active layer 215a.

The organic emitting layer 265 contacts the first electrode 255 through the opening of the passivation layer 260. The organic emitting layer 265 contacts a side surface and partially contacts an upper surface of the passivation layer 260.

The first electrode 255 is transparent and the second electrode 270 is opaque. The first electrode 255 may function as an anode and the second electrode 270 may function as a cathode, and the first electrode 255 may have a work function higher than the second electrode 270. The first electrode 255 may include a transparent conductive material including indium-tin-oxide (ITO), indium-zinc-oxide (IZO), indium-tin-zinc-oxide (ITZO), or the like.

The organic emitting layer 255 may include a hole injection layer, a hole transporting layer, an emitting material layer, an electron transporting layer and an electron injection layer. When the first and second electrodes 255 and 270 function as the anode and the cathode, respectively, the hole injection layer, the hole transporting layer, the emitting material layer, the electron transporting layer and the electron injection layer may be sequentially disposed in a direction from the first electrode 255 to the second electrode 270.

As described above, in the second embodiment, the shielding pattern completely covers the active layer in the driving transistor and is electrically connected to the power line. Accordingly, an exterior light is effectively shielded and the driving thin film transistor can be operated normally. As a result, contrast ratio increases, power consumption and noise decrease, and thus display quality can be improved. Also, the reliability of the thin film transistor and the organic electroluminescent diode can be increased.

The shielding pattern in the second embodiment can be applicable to the switching thin film transistor and thin film transistors for a driving circuit formed on the same substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An electroluminescent display device, comprising:
a shielding pattern on a substrate;
a thin film transistor including a semiconductor layer that is disposed on the shielding pattern and that has an active portion and source and drain ohmic contact portions, wherein the thin film transistor further includes a gate electrode corresponding to the active portion, and source and drain electrodes connected to the source and drain ohmic contact portions, respectively;
an organic electroluminescent diode connected to the thin film transistor;
a power line connected to the thin film transistor and the shielding pattern;
a buffer layer between the shielding pattern and the semiconductor layer;
a gate insulating layer between the semiconductor layer and the gate electrode; and
an interlayer insulating film between the gate electrode and the source and drain electrodes, wherein the buffer layer, the gate insulating layer and the interlayer insulating layer has a contact hole through which the power line contacts the shielding pattern, and
wherein the shielding pattern covers the active portion.

2. The device according to claim 1, wherein the shielding pattern completely covers the active portion.

3. The device according to claim 1, wherein the organic electroluminescent diode includes a first electrode connected to the thin film transistor, an organic emitting layer on the first electrode, a second electrode on the organic emitting layer.

4. The device according to claim 3, wherein the first electrode is transparent, and the second electrode is opaque.

5. The device according to claim 1, wherein the second electrode covers the active portion.

6. The device according to claim 1, wherein the organic electroluminescent diode emits light toward the substrate.

* * * * *